(12) United States Patent
Meir (10) Patent No.: US 11,028,980 B2
(45) Date of Patent: *Jun. 8, 2021

(54) FLEXIBLE STRIP LIGHTING APPARATUS AND METHODS

(71) Applicant: Ecosense Lighting Inc., Los Angeles, CA (US)

(72) Inventor: Ariel Meir, Brooklyn, NY (US)

(73) Assignee: ECOSENSE LIGHTING INC., Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/537,863

(22) Filed: Aug. 12, 2019

(65) Prior Publication Data
US 2020/0141546 A1 May 7, 2020

Related U.S. Application Data (63) Continuation of application No. 16/004,936, filed on Jun. 11, 2018, now Pat. No. 10,378,705, which is a
(Continued)

(51) Int. Cl.
*F21S 4/00* (2016.01)
*F21S 4/22* (2016.01)
(Continued)

(52) U.S. Cl.
CPC .................. *F21S 4/22* (2016.01); *F21K 9/64* (2016.08); *H05K 3/285* (2013.01); *H05K 3/30* (2013.01);
(Continued)

(58) Field of Classification Search
CPC ............... F21S 4/20–26; H05K 3/284; H05K 2201/0133
See application file for complete search history.

(56) References Cited

U.S. PATENT DOCUMENTS

| 4,445,164 A | 4/1984 | Giles, III et al. |
| 4,580,859 A | 4/1986 | Frano et al. |

(Continued)

FOREIGN PATENT DOCUMENTS

| CA | 2623604 A | 8/2009 |
| CN | 101592291 A | 12/2009 |

(Continued)

OTHER PUBLICATIONS

International Search Report and Written Opinion dated Nov. 27, 2013 in PCT Application No. PCT/US2013/045708.
(Continued)

*Primary Examiner* — Sean P Gramling
(74) *Attorney, Agent, or Firm* — Jay M. Brown (57) ABSTRACT

According to at least one aspect, a lighting system is provided. The lighting system includes a first lighting device comprising a first light emitting diode (LED), a second lighting device comprising a second LED, a two-part connector configured to electrically couple the first lighting device to the second lighting device and comprising a first connector portion attached to the first lighting device and a second connector portion attached to the second lighting device, at least one elastomer commonly encapsulating the first lighting device, the second lighting device, and the two-part connector, and a cutting device configured to facilitate separation of the first lighting device from the second lighting device at least in part by cutting at least some of the at least one elastomer that is adjacent a surface of the two-part connector.

20 Claims, 4 Drawing Sheets

Related U.S. Application Data continuation of application No. 14/967,125, filed on Dec. 11, 2015, now Pat. No. 10,030,828, which is a continuation of application No. 14/523,392, filed on Oct. 24, 2014, now Pat. No. 9,976,710.

(60) Provisional application No. 61/897,448, filed on Oct. 30, 2013.

(51) Int. Cl.
| | |
|---|---|
| H05K 3/36 | (2006.01) |
| H05K 3/30 | (2006.01) |
| H05K 3/28 | (2006.01) |
| F21K 9/64 | (2016.01) |
| F21Y 115/10 | (2016.01) |
| H05K 1/14 | (2006.01) |

(52) U.S. Cl.
CPC .......... *H05K 3/361* (2013.01); *F21Y 2115/10* (2016.08); *H05K 1/142* (2013.01); *H05K 3/284* (2013.01); *H05K 2201/0133* (2013.01); *H05K 2201/10106* (2013.01); *H05K 2203/1305* (2013.01); *Y10T 29/49126* (2015.01)

(56) References Cited

U.S. PATENT DOCUMENTS

| | | | |
|---|---|---|---|
| 4,603,496 A | 8/1986 | Latz | |
| 4,727,648 A | 3/1988 | Savage | |
| 4,837,927 A | 6/1989 | Savage | |
| 5,087,212 A | 2/1992 | Hanami | |
| 5,174,649 A | 12/1992 | Alston | |
| 5,241,457 A | 8/1993 | Sasajima | |
| 5,387,901 A | 2/1995 | Hardt | |
| 5,436,809 A | 6/1995 | Brassier et al. | |
| 5,490,048 A | 2/1996 | Brassier et al. | |
| 5,628,557 A | 5/1997 | Huang | |
| 5,632,551 A | 5/1997 | Roney et al. | |
| 5,658,066 A | 8/1997 | Hirsch | |
| 5,821,695 A | 10/1998 | Vilanilam | |
| 6,354,714 B1 | 3/2002 | Rhodes | |
| 6,426,704 B1 | 6/2002 | Hutchison | |
| 6,439,743 B1 | 8/2002 | Hutchison | |
| 6,450,662 B1 | 9/2002 | Hutchison | |
| 6,450,664 B1 | 9/2002 | Kelly | |
| 6,473,002 B1 | 10/2002 | Hutchison | |
| 6,474,839 B1 | 11/2002 | Hutchison | |
| 6,527,422 B1 | 3/2003 | Hutchison | |
| 6,530,674 B2 | 3/2003 | Grierson et al. | |
| 6,582,103 B1 | 6/2003 | Popovich | |
| 6,590,235 B2 | 7/2003 | Carey | |
| 6,601,970 B2 | 8/2003 | Ueda et al. | |
| 6,676,284 B1 | 1/2004 | Wynne | |
| 6,773,138 B2 | 8/2004 | Coushaine | |
| 6,824,296 B2 | 11/2004 | Souza et al. | |
| 6,827,469 B2 | 12/2004 | Coushaine et al. | |
| 6,880,952 B2 | 4/2005 | Kiraly et al. | |
| 6,893,144 B2 | 5/2005 | Fan | |
| 6,979,097 B2 | 12/2005 | Elam et al. | |
| 7,093,958 B2 | 8/2006 | Coushaine | |
| 7,111,964 B2 | 9/2006 | Suehiro | |
| 7,132,804 B2 | 11/2006 | Lys et al. | |
| 7,150,553 B2 | 12/2006 | English et al. | |
| 7,159,997 B2 | 1/2007 | Reo et al. | |
| 7,161,311 B2 | 1/2007 | Mueller et al. | |
| 7,210,957 B2 | 5/2007 | Mrakovich et al. | |
| 7,221,104 B2 | 5/2007 | Lys et al. | |
| 7,229,192 B2 | 6/2007 | Mayfield et al. | |
| 7,261,435 B2 | 8/2007 | Gould et al. | |
| 7,267,461 B2 | 9/2007 | Kan et al. | |
| 7,360,925 B2 | 4/2008 | Coushaine | |
| 7,414,269 B2 | 8/2008 | Grotsch | |
| 7,455,422 B2 | 11/2008 | Gould et al. | |
| 7,456,499 B2 | 11/2008 | Loh | |
| 7,481,552 B2 | 1/2009 | Mayfield et al. | |
| 7,481,566 B2 | 1/2009 | Han | |
| 7,530,716 B2 | 5/2009 | Mayfield et al. | |
| 7,540,761 B2 | 6/2009 | Weber et al. | |
| 7,549,786 B2 | 6/2009 | Higley et al. | |
| 7,575,332 B2 | 8/2009 | Cok | |
| 7,595,113 B2 | 9/2009 | Miyoshi | |
| 7,604,365 B2 | 10/2009 | Chang | |
| 7,654,703 B2 | 2/2010 | Kan et al. | |
| 7,700,965 B2 | 4/2010 | Chang | |
| 7,703,951 B2 | 4/2010 | Piepgras et al. | |
| 7,712,926 B2 | 5/2010 | Matheson | |
| 7,727,009 B2 | 6/2010 | Goto | |
| 7,731,396 B2 | 6/2010 | Fay et al. | |
| 7,744,266 B2 | 6/2010 | Higley et al. | |
| 7,766,518 B2 | 8/2010 | Piepgras et al. | |
| 7,806,562 B2 | 10/2010 | Behr et al. | |
| 7,810,955 B2 | 10/2010 | Stimac et al. | |
| 7,810,995 B2 | 10/2010 | Fadler et al. | |
| 7,841,753 B2 | 11/2010 | Liu | |
| 7,857,482 B2 | 12/2010 | Reo et al. | |
| 7,866,847 B2 | 1/2011 | Zheng | |
| 7,878,683 B2 | 2/2011 | Logan et al. | |
| 7,918,589 B2 | 4/2011 | Mayfield et al. | |
| 7,922,364 B2 | 4/2011 | Tessnow et al. | |
| 7,923,907 B2 | 4/2011 | Tessnow et al. | |
| 7,952,114 B2 | 5/2011 | Gingrich, III et al. | |
| 7,961,113 B2 | 6/2011 | Rabiner et al. | |
| 7,972,038 B2 | 6/2011 | Albright et al. | |
| 7,988,336 B1 | 8/2011 | Harbers et al. | |
| 7,997,758 B2 | 8/2011 | Zhang | |
| 8,033,680 B2 | 10/2011 | Sharrah et al. | |
| 8,052,310 B2 | 11/2011 | Gingrich, III et al. | |
| 8,066,403 B2 | 11/2011 | Sanfilippo et al. | |
| 8,076,683 B2 | 12/2011 | Xu | |
| 8,113,680 B2 | 2/2012 | O'Brien et al. | |
| 8,154,864 B1 | 4/2012 | Nearman et al. | |
| 8,172,436 B2 | 5/2012 | Coleman et al. | |
| 8,207,546 B2 | 6/2012 | Harada | |
| 3,262,250 A1 | 9/2012 | Li | |
| 8,297,788 B2 | 10/2012 | Bishop | |
| 8,314,566 B2 | 11/2012 | Steele | |
| 8,348,460 B2 | 1/2013 | Bachl | |
| 8,371,723 B2 | 2/2013 | Nall | |
| 8,434,897 B2 | 5/2013 | Logan et al. | |
| 8,434,898 B2 | 5/2013 | Sanfilippo et al. | |
| 8,449,128 B2 | 5/2013 | Ko | |
| 8,454,193 B2 | 6/2013 | Simon et al. | |
| 8,525,190 B2 | 9/2013 | Donofrio | |
| 8,545,045 B2 | 10/2013 | Tress | |
| 8,552,456 B1 | 10/2013 | Sun | |
| 8,575,646 B1 | 11/2013 | Shum | |
| 8,598,778 B2 | 12/2013 | Allen | |
| 8,616,720 B2 | 12/2013 | Carney et al. | |
| 8,697,458 B2 | 4/2014 | Nolan | |
| 8,702,265 B2 | 4/2014 | May | |
| 8,748,202 B2 | 6/2014 | Kwon | |
| 8,764,220 B2 | 7/2014 | Chan et al. | |
| 8,791,485 B2 | 7/2014 | Ohbayashi | |
| 8,820,964 B2 | 9/2014 | Gould | |
| 8,876,322 B2 | 11/2014 | Alexander | |
| 8,876,325 B2 | 11/2014 | Lu et al. | |
| 8,969,894 B2 | 3/2015 | Lee | |
| 8,998,448 B2 | 4/2015 | Chang | |
| 9,016,895 B2 | 4/2015 | Handsaker | |
| 9,052,075 B2 | 6/2015 | Demuynck et al. | |
| 9,157,622 B2 | 10/2015 | Yanping | |
| 9,188,290 B2 | 11/2015 | Lay et al. | |
| 9,285,085 B2 | 3/2016 | Carney et al. | |
| 9,518,706 B2 | 12/2016 | Chan et al. | |
| 9,605,812 B2 | 3/2017 | Van De Ven et al. | |
| 9,651,227 B2 | 5/2017 | Pickard et al. | |
| 9,666,772 B2 | 5/2017 | Ibbetson | |
| 9,722,158 B2 | 8/2017 | Chan et al. | |
| 9,874,333 B2 | 1/2018 | Lay et al. | |
| 9,976,710 B2 | 5/2018 | Meir | |
| 9,995,444 B2 | 6/2018 | Leichner | |
| 10,030,828 B2 | 7/2018 | Meir | |

(56) References Cited

U.S. PATENT DOCUMENTS

| | | |
|---|---|---|
| 10,100,988 B2 | 10/2018 | Rodgers et al. |
| 10,132,476 B2 | 11/2018 | Meir |
| 10,228,099 B2 | 3/2019 | Meir |
| 10,378,705 B2 | 8/2019 | Meir |
| 10,465,864 B2 | 11/2019 | Leichner |
| 10,584,860 B2 | 3/2020 | Dungan et al. |
| 10,612,747 B2 | 4/2020 | Rodgers et al. |
| 2002/0117692 A1 | 8/2002 | Lin |
| 2003/0058658 A1 | 3/2003 | Lee |
| 2003/0072156 A1 | 4/2003 | Pohlert et al. |
| 2003/0198049 A1 | 10/2003 | Hulse |
| 2004/0070855 A1 | 4/2004 | Benitez |
| 2005/0092517 A1* | 5/2005 | Fan .................. F21S 4/24 174/117 FF |
| 2005/0221518 A1 | 10/2005 | Andrews |
| 2005/0225985 A1 | 10/2005 | Catalano |
| 2005/0280016 A1 | 12/2005 | Mok |
| 2005/0286265 A1 | 12/2005 | Zampini et al. |
| 2006/0134440 A1 | 6/2006 | Crivello |
| 2006/0141851 A1 | 6/2006 | Matsui et al. |
| 2006/0146531 A1 | 7/2006 | Reo et al. |
| 2006/0187653 A1 | 8/2006 | Olsson |
| 2007/0064428 A1 | 3/2007 | Beauchamp |
| 2007/0092736 A1 | 4/2007 | Boardman |
| 2007/0103902 A1 | 5/2007 | Hsiao |
| 2007/0205425 A1 | 9/2007 | Harada |
| 2008/0048200 A1 | 2/2008 | Mueller |
| 2008/0080196 A1 | 4/2008 | Ruud |
| 2008/0144322 A1 | 6/2008 | Norfidathul |
| 2008/0165530 A1 | 7/2008 | Hendrikus |
| 2008/0244944 A1 | 10/2008 | Nall |
| 2008/0298058 A1 | 12/2008 | Kan et al. |
| 2009/0021936 A1 | 1/2009 | Stimac et al. |
| 2009/0109539 A1 | 4/2009 | Devos |
| 2009/0167203 A1 | 7/2009 | Dahlman et al. |
| 2009/0195168 A1 | 8/2009 | Greenfield |
| 2009/0225546 A1 | 9/2009 | Pearson |
| 2009/0272996 A1 | 11/2009 | Chakraborty |
| 2009/0310354 A1 | 12/2009 | Zampini et al. |
| 2009/0321766 A1 | 12/2009 | Chang |
| 2010/0008090 A1 | 1/2010 | Li |
| 2010/0033948 A1 | 2/2010 | Harbers et al. |
| 2010/0060157 A1 | 3/2010 | Shi |
| 2010/0060202 A1 | 3/2010 | Melanson et al. |
| 2010/0072488 A1 | 3/2010 | Bierhuizen |
| 2010/0246179 A1 | 9/2010 | Long et al. |
| 2010/0254134 A1 | 10/2010 | McCanless |
| 2010/0308354 A1 | 12/2010 | David |
| 2011/0013387 A1 | 1/2011 | Kanade et al. |
| 2011/0025951 A1 | 2/2011 | Jones |
| 2011/0051394 A1 | 3/2011 | Bailey |
| 2011/0051407 A1 | 3/2011 | St. Ives et al. |
| 2011/0051425 A1 | 3/2011 | Tsuchiya |
| 2011/0062470 A1 | 3/2011 | Bierhuizen |
| 2011/0089453 A1 | 4/2011 | Min |
| 2011/0122643 A1 | 5/2011 | Spark et al. |
| 2011/0134634 A1 | 6/2011 | Gingrich, III et al. |
| 2011/0136374 A1 | 6/2011 | Mostoller et al. |
| 2011/0164426 A1 | 7/2011 | Lee |
| 2011/0193490 A1 | 8/2011 | Kumar |
| 2011/0198067 A1 | 8/2011 | Hada |
| 2011/0210364 A1 | 9/2011 | Nolan |
| 2011/0222270 A1 | 9/2011 | Porciatti |
| 2011/0255287 A1 | 10/2011 | Li |
| 2011/0280020 A1 | 11/2011 | Chen |
| 2011/0303935 A1 | 12/2011 | Chern |
| 2012/0002417 A1 | 1/2012 | Li |
| 2012/0025241 A1 | 2/2012 | Xiao |
| 2012/0025729 A1 | 2/2012 | Melanson et al. |
| 2012/0051048 A1 | 3/2012 | Smit et al. |
| 2012/0051056 A1 | 3/2012 | Derks et al. |
| 2012/0051068 A1 | 3/2012 | Pelton et al. |
| 2012/0087124 A1 | 4/2012 | Ravillisetty |
| 2012/0106152 A1 | 5/2012 | Zheng et al. |
| 2012/0140474 A1 | 6/2012 | Jurik et al. |
| 2012/0250309 A1 | 10/2012 | Handsaker |
| 2012/0267650 A1 | 10/2012 | Schubert |
| 2013/0021797 A1 | 1/2013 | Kubo |
| 2013/0063939 A1 | 3/2013 | Kondo |
| 2013/0083524 A1 | 4/2013 | Devorris |
| 2013/0134445 A1 | 5/2013 | Tarsa |
| 2013/0214691 A1 | 8/2013 | Chen |
| 2013/0265750 A1 | 10/2013 | Pickard |
| 2013/0272000 A1 | 10/2013 | Pearson |
| 2013/0274398 A1 | 10/2013 | Shiobara |
| 2013/0292709 A1 | 11/2013 | Tong |
| 2013/0313965 A1 | 11/2013 | Chiang |
| 2014/0001952 A1 | 1/2014 | Harris et al. |
| 2014/0036500 A1 | 2/2014 | Eggleton |
| 2014/0043812 A1 | 2/2014 | Moreau |
| 2014/0168997 A1 | 6/2014 | Lee |
| 2014/0176016 A1 | 6/2014 | Li et al. |
| 2014/0177262 A1 | 6/2014 | Lai |
| 2014/0268720 A1 | 9/2014 | Dungan et al. |
| 2014/0268748 A1 | 9/2014 | Lay et al. |
| 2014/0268810 A1 | 9/2014 | Marquardt |
| 2014/0334142 A1 | 11/2014 | Levante |
| 2015/0034976 A1 | 2/2015 | Kim |
| 2015/0041839 A1 | 2/2015 | Sakai |
| 2015/0062965 A1 | 3/2015 | Oh |
| 2015/0117022 A1 | 4/2015 | Meir |
| 2015/0144918 A1 | 5/2015 | Cho |
| 2015/0145406 A1 | 5/2015 | Li |
| 2015/0252982 A1 | 9/2015 | Demuynck et al. |
| 2015/0276170 A1 | 10/2015 | Motoyanagi |
| 2015/0283768 A1 | 10/2015 | Marquardt |
| 2015/0316219 A1 | 11/2015 | Mallory |
| 2015/0326767 A1 | 11/2015 | Kim |
| 2016/0003424 A1 | 1/2016 | Wu |
| 2016/0035944 A1 | 2/2016 | Spanard |
| 2016/0076743 A1 | 3/2016 | Deutsch |
| 2016/0093780 A1 | 3/2016 | Beppu |
| 2016/0195225 A1 | 7/2016 | Carney et al. |
| 2016/0201861 A1 | 7/2016 | Meir |
| 2016/0327249 A1 | 11/2016 | Pearson |
| 2016/0327256 A1 | 11/2016 | Hall |
| 2017/0009957 A1 | 1/2017 | Lim et al. |
| 2017/0038015 A1 | 2/2017 | Lunz |
| 2017/0261186 A1 | 9/2017 | Meir |
| 2017/0261187 A1 | 9/2017 | Meir |
| 2019/0219251 A1 | 7/2019 | Meir |
| 2019/0383450 A1 | 12/2019 | Meir |
| 2020/0096178 A1 | 3/2020 | Aviram |
| 2020/0141546 A1 | 5/2020 | Meir |
| 2020/0144468 A1 | 5/2020 | Meir |
| 2020/0191370 A1 | 6/2020 | Shohat |

FOREIGN PATENT DOCUMENTS

| | | |
|---|---|---|
| CN | 201590432 U | 9/2010 |
| CN | 201739849 U | 2/2011 |
| CN | 101997074 A | 3/2011 |
| CN | 202040752 U | 11/2011 |
| CN | 102269351 A | 12/2011 |
| EP | 0592746 B1 | 3/1997 |
| EP | 2474775 B1 | 11/2013 |
| EP | 2256833 B1 | 4/2014 |
| EP | 2484956 B1 | 6/2014 |
| GB | 2457016 A | 8/2009 |
| JP | 2011508406 T | 3/2011 |
| JP | 2011204495 A | 10/2011 |
| JP | 2011204658 A | 10/2011 |
| KR | 1020070039683 A | 4/2007 |
| KR | 20090013704 A | 2/2009 |
| KR | 100974942 B1 | 8/2010 |
| KR | 1020120050280 A | 5/2012 |
| KR | 1020110106033 A | 6/2013 |
| WO | 2002015281 A2 | 2/2002 |
| WO | 2013059298 A1 | 4/2013 |
| WO | 2014082262 A1 | 5/2014 |
| WO | 2014099681 A2 | 6/2014 |
| WO | 2014099681 A3 | 12/2014 |
| WO | 2015066184 A1 | 5/2015 |
| WO | 2019213299 A1 | 11/2019 |

(56) References Cited

FOREIGN PATENT DOCUMENTS

OTHER PUBLICATIONS

PCT/US2012/060588, International Application Serial No. PCT/US2012/060588, International Search Report and Written Opinion dated Mar. 29, 2013, Ecosense Lighting Inc. et al, 10 pages.

PCT/US2012/060588, "International Application Serial No. PCT/US2012/060588, International Preliminary Report on Patentability and Written Opinion dated May 1, 2014", Ecosense Lighting Inc. et al, 7 Pages.

PCT/US2013/075172, "International Application Serial No. PCT/US2013/075172, International Search Report and Written Opinion dated Sep. 26, 2014", Ecosense Lighting Inc., 16 Pages.

PCT/U52014/062905, International Preliminary Report on Patentability dated May 3, 2016 (7 pp).

PCT/US2014/062905, Written Opinion of the Int'l Searching Authority dated Jan. 22, 2015 (6 pp).

* cited by examiner

FLEXIBLE STRIP LIGHTING APPARATUS AND METHODS

CROSS-REFERENCE TO RELATED APPLICATIONS

This application is a continuation of U.S. patent application Ser. No. 16/004,936, filed Jun. 11, 2018 which is a continuation of U.S. patent application Ser. No. 14/967,125 (now U.S. Pat. No. 10,228,099), filed Dec. 11, 2015, which is a continuation of U.S. patent application Ser. No. 14/523,392 (now U.S. Pat. No. 9,976,710), filed on Oct. 24, 2014, which claims priority to U.S. Provisional Application Ser. No. 61/897,448, filed Oct. 30, 2013, each of which is hereby incorporated by reference in its entirety.

BACKGROUND OF THE PRESENT INVENTION

Certain types of lighting emit light, such as white light, in a particular color temperature. White light may be characterized in terms of temperature. Color temperatures over 5,000K are considered cool colors, meaning they emit light in a bluish-white range, whereas lower color temperatures (typically 2,200-3,000K) are considered warm colors (emitting light in a yellowish white through red range). Currently with LEDs, if the color goes below 2,700K, the emitted light is amber, which does not provide for the preferred color in typical residential and commercial applications. At present there is a desire to emit light in the warm range with LEDs which themselves emit light at below 2,700K.

In addition, the present invention is directed to meeting a desire to have light emitted preferably by LEDs encased in flexible strips. Such flexible strip lighting can be used in a variety of applications, such as but not limited to commercial displays, under cabinets, cove/soffit, and for safety purposes (such as aisle lighting). Flexible strips permit easy installation and avoid the need to deal with stringing and interconnecting the lights and the flexible strips allow such interconnection to be in place in advance, freeing the installer (or de-installer) to lay strips instead of individual lights.

This strip lighting is particularly desirable in commercial settings, where lights are installed and uninstalled frequently, particularly in displays which have short installation durations and the need to install is under time pressures.

In many of these circumstances, the color of the light is particularly important. For example, under cabinet lighting in certain commercial environments needs to be bright white, whereas cove/soffit lighting might need to be warmer color temperatures. Such flexible strips can potentially satisfy these color and installation needs, so long as the color of the LEDs can be adjusted from flexible strip to flexible strip in the production process.

Currently the main and only way to effect color temperature of LEDs is either via phosphor directly placed on the LED chip or via remote phosphor layers that are used as lenses over blue LEDs. Such a device may not be cost effective to manufacture. Another issue with the remote phosphor is aesthetics; when the light is off, it appears bright yellow or orange depending on the color temperature of the fixture.

Prior to the present invention, the use of LED flexible strips has been limited to the color temperature offered by the LED chip and incorporating remote phosphor solutions is both impractical mechanically speaking as well as cost prohibitive. The costs accrue from manufacture of the strips, the costs associated with the need to dissipate heat from the strips, and the costs to assemble and install the strips. In short, the present invention includes a novel approach so as to make the assembly of such devices more readily usable and economic in commercial environments.

BRIEF DESCRIPTION OF THE PRESENT INVENTION

The present invention is directed to the use of light emitting diode (LED) lighting and particularly to the use of lights in flexible strips, where the color of the lighting emitted from the flexible strip is consequential to the encapsulation process and heat from the lights is adequately dissipated. Although the present invention is primarily focused on flexible linear LED lighting, it is also applicable to other LED lighting formats, such as but not limited to low voltage lighting and other such lighting and in other non-linear or non-flexible strips. The present invention is further directed to connectorization of the strips (or other form of encapsulated lights) and to a cutting tool for sizing strips for installation.

DESCRIPTION OF THE PRESENT INVENTION

The present invention is directed to various attributes of product and method of producing product, including attributes of flexible linear LED lighting, where those attributes include placing LEDs on flexible PCB, adjusting the color emitted through the an elastomeric encapsulation that encapsulates the LEDs, dissipating heat of the encapsulated LEDs and circuitry, connectorizing the encapsulated strips, and a tool for cutting the light-emitting strips. One objective is to mimic the warmth of the traditional incandescent lamp using LEDs of other wavelengths and/or emitting at lower power. Another objective is to use higher intensity LEDs and dissipate heat more effectively than in prior designs.

Color Adjustment

The present invention includes a new method to adjust the color, color temperature, color rendering index (CRI) and the different R factors that influence the color rendering of the projected light. This is achieved in part by using combinations of various silicone dyes (preferably non-phosphor based). This is a cost effective and more aesthetically pleasing solution than prior solutions, particularly when the fixture/light source is visible to the end user.

With regard to adjusting the R factors, the present invention permits adjustment of the R factor from R1-R8 (color rendering index or CRI values) as well as R9-R14 values. CRI is an industry rating system that measures the accuracy of how well a light source reproduces the color of an illuminated object. Test colors R1-R8 are pastel-like and R9+ are more vivid.

The present invention is further directed, in part, to pigmentation of an elastomer. Such elastomers may be any of silicones, polyurethanes, thermoplastics such as poly (methyl methacrylate) ("PMMA") or another similar elastomer (referred to herein collectively as "silicone"). The silicone pigmentation results in an apparent clear strip, but with the ability to change the color of the emitted light of the encapsulated LEDs (or other light source) to a more desirable color. The pigmentation element may be added in various concentrations comprising one or more pigments (such as but not limited to yellow, red, or brown), which are distributed uniformly through the silicone. The lights themselves are also distributed, typically uniformly, and encapsulated in the silicone, together with a printed circuit board (PCB) and end connectors. The result is a flexible strip with embedded LEDs which emits light at a color temperature different from the actual LED's color temperature. The strips are attachable to one another.

The preferred pigments used are SILc pig silicone based, although alternate pigments may be used so long as the pigments distribute uniformly in silicone.

For example, the present invention can use 2,700K LEDs and produce product that emits light at a discrete, pre-determined point within an 1,800K-5,000K temperature range. In this example, the basic formula is a 1:20 ratio between red and yellow, and the ratio is adjusted in varying concentrations to achieve different values in the range noted above. The more concentrated, the closer the color is to 2,200K. For a bottom end of the range (2,200K-2,400K), brown pigment may be added to the red and yellow mixture above at 1:20 ratio. In the preferred embodiment, once the pigmentation is added to the silicone, the composition is maintained in a liquid form in a linear mold, with lights and PCB laid in the silicone as desired, and the silicone with pigmentation is allowed to harden. The mixtures noted above are mixed into the silicone and dispensed over the LED strip that is sitting inside a silicone tray. This process fully encapsulates the LEDs.

Note that the process may result in various shades and colors, depending upon the pigments and quantities used. Lights can appear white, yellow, red, and green, among others.

In another example, the LEDs (or other lights) can be inserted with lensing to direct the lighting if desired.

Encapsulation

Figure 1:
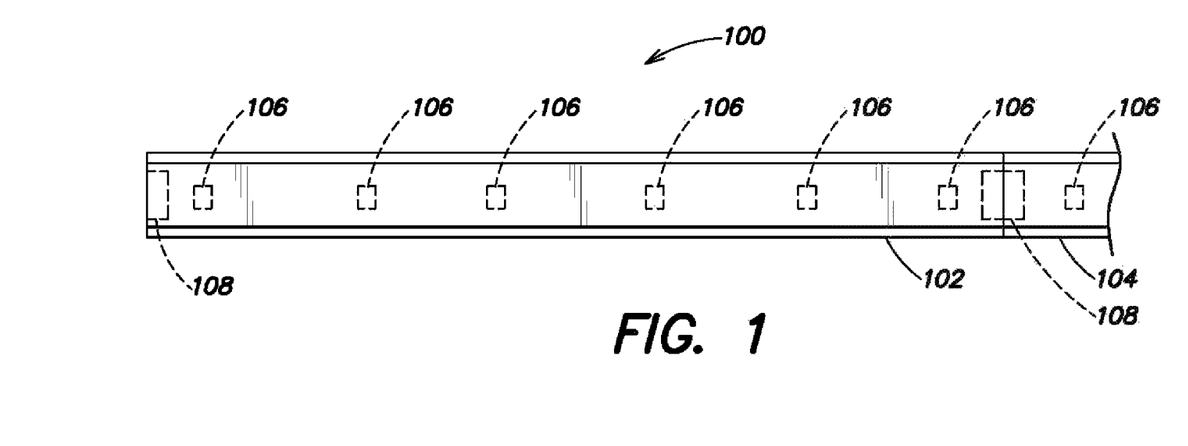
FIG. 1 displays a top-down view of an encapsulated LED strip.
Figure 2:
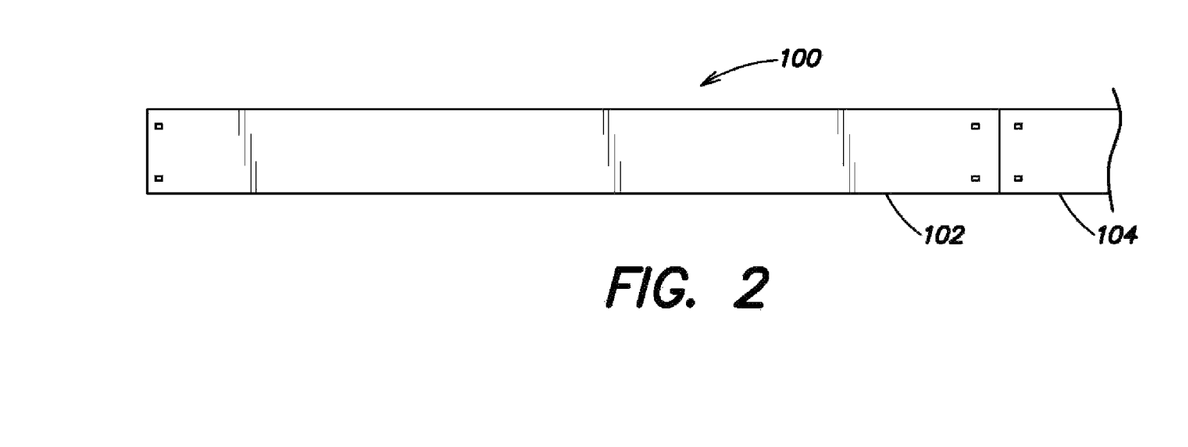
FIG. 2 depicts the strip of FIG. 1 in a bottom-up view.

The present invention is also directed to encapsulating LED lighting in a flexible strip. FIG. 1 shows a top-down view of the encapsulated silicone strip 100 of the present invention, including the pre-selected LEDs 106. FIG. 2 shows a bottom-up view. These views show a complete first strip 102 attached to a second strip 104 and, particularly, the two strips 102 and 104 are commonly encapsulated.

In the preferred embodiment of the present invention Sorta clear 40 is used as the encapsulating silicone, which is a platinum, or "addition", cured silicone. Alternatively, tin, or "condensation", cured silicone may be used. Platinum-cured is preferred because it is longer lasting without becoming brittle, does not shrink and is more durable in various environmental conditions, such as changes in temperature or in the presence of other chemicals.

In the present invention, strips of LED-mounted PCBs ("boards") are attached to one another to form a potentially lengthy chain and may be commonly or separately encapsulated in silicone (or some other comparable encapsulator which allows for light from LEDs to filter through). Each strip 102 and 104 is nominally six inches long, although the length of a strip may vary based on application of use. Each strip 102 and 104 is preferably the same length (other than end strips, which may be cut to fit), although different length strips may alternatively be used.

Figure 3:
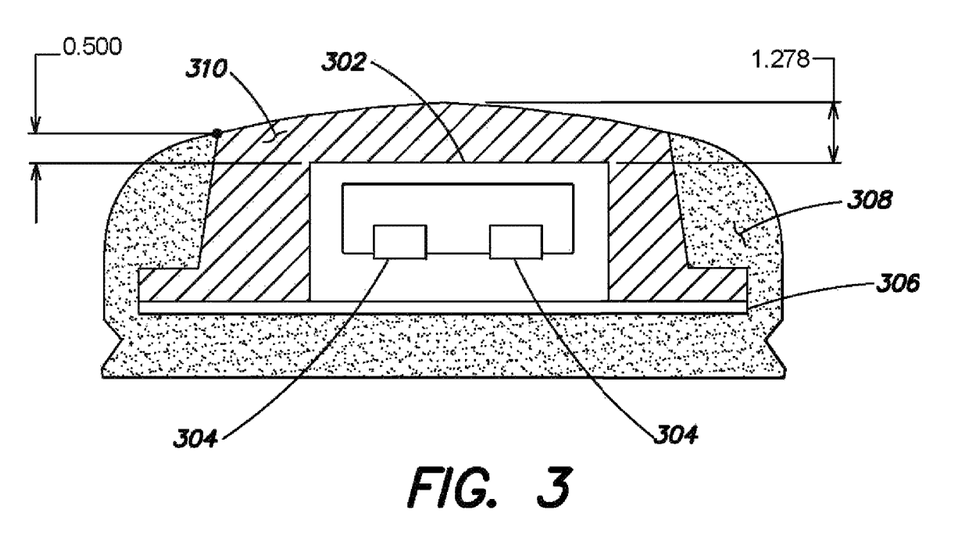
FIG. 3 depicts one view of the connector of the present invention.
Figure 4:
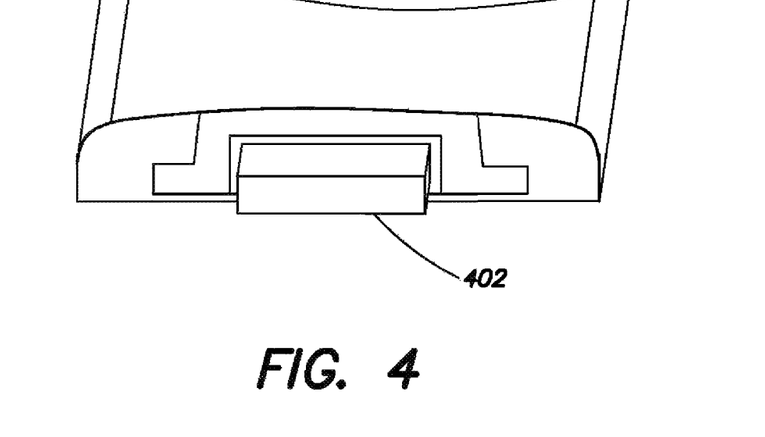
FIG. 4 depicts an alternate view of the connector of the present invention.
Figure 5:
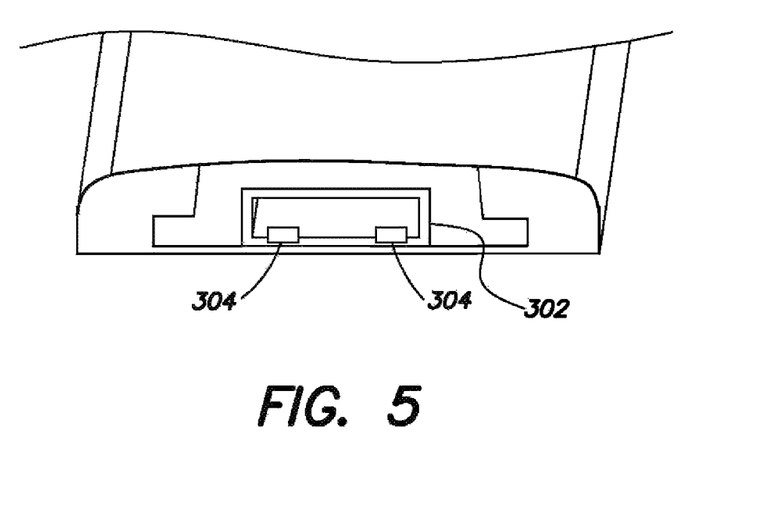
FIG. 5 depicts yet another alternate view of the connector of the present invention.

At each end of the strip, or at regular intervals in the strip, connectors 108 are used for connecting sections or strips. FIGS. 3-5 show views of the preferred embodiment of the physical connector of the present invention. A connector 302 at one end mates with a connector 402 at the end of the adjoining strip. A PCB 306 is embedded within a strip, and runs from connector to connector. That is, a connector attaches to each end of the PCB 306, all encapsulated within a strip, other than the exposed ends of the connectors.

The net result is a linear LED strip encompassing color-changing characteristics for internal lighting.

PCBs

In the preferred embodiment, a PCB runs the length of the strip. Like the strip, the PCB is flexible. Each PCB has an upper surface and a lower surface. LEDs are mounted on the upper surface, preferably at equally spaced intervals. Also, other electrical elements, such as but not limited to a resistor and a current regulator, are also mounted along the PCB.

FIG. 3 shows a cross-section cut of the encapsulated silicone strip 100 of the present invention, including lighting and connector.

The PCB 306 has two layers/levels. Each consists of at least two traces 304 used to run 24 VDC through the fixture. One layer is the general one that goes through an entire potentially 22 foot run (44 boards in total) and the top layer is used for distributing the power for each individual circuit (every 6 inch board with 6 LEDs, 1 resistor and 1 current regulator). As opposed to present solutions, which only utilize the 'real estate' covered by the footprint of the LED and its immediate surrounding portion of the PCB 306 for cooling, the present invention utilizes the entirety of the PCB traces 304 to dissipate heat. In other words, the present invention, utilizes the copper that runs through the length of the PCB 306 to dissipate the heat.

The PCB 306 itself is made of FR4 material (fiberglass composite with an epoxy resin binder) sandwiched by two layers of copper.

Following mounting of the elements, including connectors, the flexible PCB 306 is encapsulated in silicone.

Importantly, in other embodiments, the strip need not be linear or flexible but could take various other shapes or forms. For example, a partially circular strip might be beneficial for some applications. In addition, the hardness of the silicone can vary by introducing quantities of a hardening agent to the silicone.

Encapsulation is accomplished by placing the PCB 306 in a silicone channel/extrusion 308 and the channel is filled with silicone 310. Once cured, the PCB 306 adheres to the silicone material that makes up the channel and thereby fully encapsulates the PCB 306.

Heat Dissipation

In addition to encapsulating the lights and changing color, the present invention addresses the need to dissipate heat from the encapsulated lights. In the preferred embodiment, heat dissipation is achieved both through properties of the encapsulating silicone as well as through the internal PCBs, although in other embodiments, one or the other might be used alone.

In the preferred embodiment, the silicone is formed of two distinct layers where one layer, in this embodiment the lower layer, allows for improved heat dissipation and the upper layer and sides may not. In this embodiment, the silicone used in the lower portion might be more porous or might have improved heat dissipating qualities and, consequently, the silicone-based material in the upper portion might be somewhat different than that of the lower portion. Also, by having two different types of silicone serving to sandwich an LED flexible strip, manufacture can be simpler. That is, the lower portion may be extruded, the LED flexible strip laid on top, and the upper portion formed thereafter and formed to adhere to the lower portion.

A further advantage of use of heat dissipative silicone is to safely encapsulate higher wattage/output products while managing the heat dissipation. That is, because heat may be dissipated through the design, higher watt and therefore more intense lighting can be used. The heat dissipation ability needs to be matched to the embedded wattage.

Alternatively, to achieve this goal, the silicone used may include heat dissipative properties, either in the silicone itself, how the silicone is hardened, or the addition of added materials in the silicone composition. In the preferred embodiment, the silicone itself provides for dissipation of heat through the bottom portion.

Alternatively, the heat dissipative material is incorporated in the base of the LED circuitry, which is also fully encapsulated in silicone. In the preferred embodiment, the PCB and, more particularly, the copper in the PCB is used for heat dissipative purposes, and both sides of the PCB are utilized.

Because of the unique nature of the material—silicone plus one or more pigments and heat dissipative capability—the co-extruding and assembly processes are unique as is the application of use. The extruding process is unique in lighting because the process requires two different extrusion materials to be coextruded and bonded, so that at the end of the extrusion process the result is one piece made up of 2 bonded materials.

Connectorization

The usual way of connecting flexible strips in installations involves soldering wires together. Such an approach is labor intensive and expensive. While AVX connectors have been used for connecting strips of LED lighting, the present invention makes use of them on a flex board. That is, the connectors are mounted on a flexible board to facilitate better electrical connectivity than in previous designs. FIGS. 4 and 5 show the male connector 402 and female connector 302, respectively, of the invention. Further, the connectors 302 and 402 may be connected to one another and encapsulated.

Figure 6:
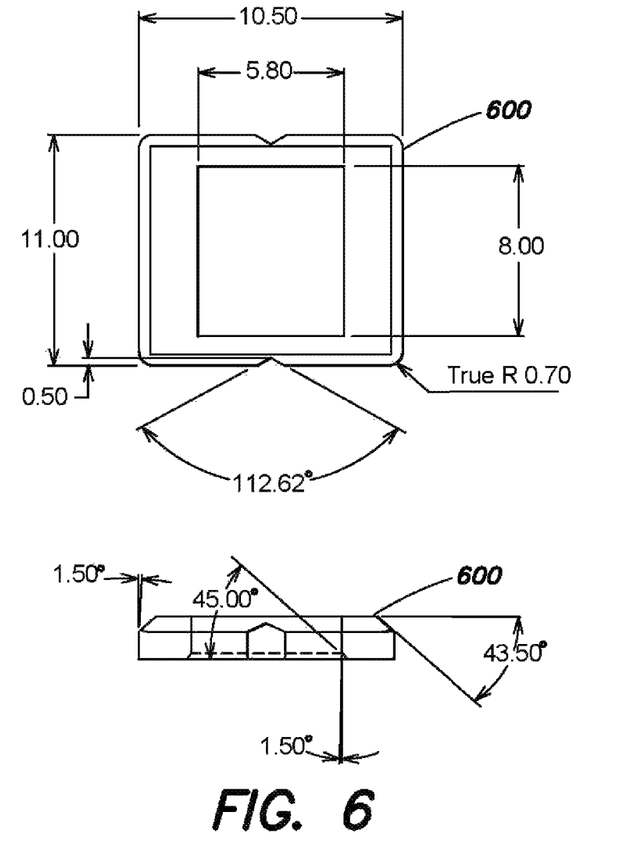
FIG. 6 depicts a view of the connector bracket of the present invention.

For such use, the present invention includes a new and improved bracket (made of high density polyethylene, or HDPE) which provides a benefit of preventing board to board disconnect. That is, the flexible strips may be extruded in defined lengths and, in implementation, may be connected electrically with AVX connectors, and help in place more securely mechanically using the aforementioned bracket. The brackets are physically connected to the end connectors and form a solid connection between flexible strips. The need for this bracket arises due to the flexible nature of our product and the fashion it is handled in the field. These connectors are designed to be used on rigid and none accessible circuitry. We are using them in a very different method. See FIG. 6 for a detailed drawing of the connector bracket 600 of the present invention, including nominal dimensions. As shown, the connector bracket 600 is a rectangular bracket that is 10.5 millimeters by 11 millimeters in size, has a cutout in the center of the bracket that is 5.8 millimeters by 8 millimeters in size, has corners with a radius of 0.7 millimeters, and a triangular cutout along the top and bottom sides of the bracket that are 0.5 millimeters deep. Of course, dimensions may vary based on application.

Cutting Tool

In addition, because lengths of use vary, it is important to easily and rapidly cut lengths of the flexible stripping so as to conform to the needs of the implementation. As a result, the present invention includes a new and improved cutting tool to allow for quick and easy disconnect at any given connector point on the LED flexible strip. This cutting tool facilitates easy cutting in the field to desired lengths (based on strips nominally being six inch increments) as well as preparing either end of the cut lengths to be reconnected to an extension/jumper cable. The tool of the present invention is a hinged cutting tool made of HDPE and includes a cutting template (using metal blades) to match the connectors on the PCB.

Figure 7:
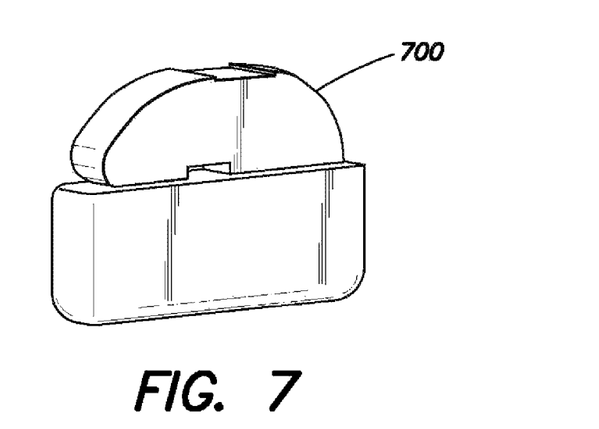
FIG. 7 depicts a rendering of the cutting tool of the present invention.

The tool of the present invention also has an additional purpose of scoring the silicone layer above the connector itself to allow for easy removal. This scoring is needed to allow a good mechanical connection with the locking mechanism of the connectors on any given end of an extension cable. See FIG. 7 for a cutting tool 700 for reference.

What is claimed is:

1. A lighting system comprising:
   a first lighting device having a first light emitting diode (LED);
   a second lighting device having a second LED;
   a two-part connector having a first connector part and a second connector part being connectable together as constituting a unitary connector joint and electrically coupling the first lighting device to the second lighting device, the first connector part being attached to the first lighting device, and the second connector part being attached to the second lighting device;
   at least one elastomer commonly encapsulating the first lighting device, the second lighting device, and the two-part connector; and
   a cutting device configured to facilitate separation of the first lighting device from the second lighting device at least in part by cutting at least some of the at least one elastomer that is adjacent to the unitary connector joint of the two-part connector.

2. The lighting system of claim 1, wherein the two-part connector is configured for reversible interconnection of the first lighting device and the second lighting device, the first connector part being reversibly connectable to the second lighting device and the second connector part being reversibly connectable to the first lighting device.

3. The lighting system of claim 1, further including a bracket being configured to secure the first connector part to the second connector part and being encapsulated by the at least one elastomer.

4. The lighting system of claim 3, wherein the cutting device is configured to cut the bracket in alignment with the unitary connector joint.

5. The lighting system of claim 1, wherein the cutting device includes a cutting template configured to match the two-part connector.

6. The lighting system of claim 5, wherein the cutting template includes at least one cutting blade.

7. The lighting system of claim 1, wherein the cutting device includes a first cutter part, and wherein the cutting device further includes a second cutter part that is movably coupled to the first cutter part.

8. A lighting method, comprising:
providing a lighting system including a first lighting device having a first light emitting diode (LED), a second lighting device having a second LED, a two-part connector having a first connector part and a second connector part being connectable together as constituting a unitary connector joint and electrically coupling the first lighting device to the second lighting device, the first connector part being attached to the first lighting device and the second connector part being attached to the second lighting device, the lighting system further including at least one elastomer commonly encapsulating the first and second lighting devices and the two-part connector, the lighting system additionally including a cutting device configured to facilitate separation of the first lighting device from the second lighting device; and
separating the first lighting device from the second lighting device using the cutting device at least in part by cutting at least some of the at least one elastomer that is adjacent to the unitary connector joint of the two-part connector.

9. The lighting method of claim 8, wherein providing the lighting system includes providing the two-part connector as being configured for reversible interconnection of the first lighting device and the second lighting device, and wherein separating the first lighting device from the second lighting device includes reversibly disconnecting the first connector part from the second lighting device and reversibly disconnecting the second connector part from the first lighting device.

10. The lighting method of claim 8, wherein providing the lighting system includes providing a bracket being configured to secure the first connector part to the second connector part and being encapsulated by the at least one elastomer.

11. The lighting method of claim 10, wherein separating the first lighting device from the second lighting device includes cutting the bracket in alignment with the unitary connector joint using the cutting device.

12. The lighting method of claim 8, wherein providing the cutting device includes providing a cutting template configured to match the two-part connector.

13. The lighting method of claim 12, wherein providing the cutting template includes providing at least one cutting blade.

14. The lighting method of claim 8, wherein providing the cutting device includes providing a first cutter part, and providing a second cutter part that is movably coupled to the first cutter part.

15. A lighting system, comprising:
a first lighting device having a first light emitting diode (LED) mounted to a first circuit board;
a second lighting device having a second LED mounted to a second circuit board;
a two-part connector having a first connector part and a second connector part being connectable together as constituting a unitary connector joint and electrically coupling the first lighting device to the second lighting device, the first connector part being mounted to the first circuit board and the second connector part being mounted to the second circuit board;
a bracket configured to secure the first connector part to the second connector part;
at least one elastomer commonly encapsulating the first lighting device, the second lighting device, the two-part connector, and the bracket; and
a cutting device configured to facilitate separation of the first lighting device from the second lighting device at least in part by cutting at least some of the at least one elastomer that is adjacent to the unitary connector joint of the two-part connector and by cutting the bracket.

16. The lighting system of claim 15, wherein the two-part connector is configured for reversible interconnection of the first lighting device and the second lighting device, the first connector part being reversibly connectable to the second lighting device and the second connector part being reversibly connectable to the first lighting device.

17. The lighting system of claim 15, wherein the cutting device is configured to cut the bracket in alignment with the unitary connector joint.

18. The lighting system of claim 15, wherein the cutting device includes a cutting template configured to match the two-part connector.

19. The lighting system of claim 18, wherein the cutting template includes at least one cutting blade.

20. The lighting system of claim 15, wherein the cutting device includes a first cutter part, and wherein the cutting device further includes a second cutter part that is movably coupled to the first cutter part.

* * * * *